(12) United States Patent
Jeong et al.

(10) Patent No.: US 8,330,356 B2
(45) Date of Patent: Dec. 11, 2012

(54) ORGANIC LIGHT EMITTING DISPLAY DEVICE WITH TRANSMITTANCE CONTROL LAYER AND METHOD OF FABRICATING THE SAME

(75) Inventors: Hee-Seong Jeong, Yongin (KR); Sam-Il Kho, Yongin (KR); Byeong-Wook Yoo, Yongin (KR); Seong-Taek Lee, Yongin (KR); Jun-Sik Oh, Yongin (KR); Gun-Shik Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 17 days.

(21) Appl. No.: 12/950,914

(22) Filed: Nov. 19, 2010

(65) Prior Publication Data

US 2011/0062427 A1    Mar. 17, 2011

Related U.S. Application Data

(63) Continuation of application No. 11/942,306, filed on Nov. 19, 2007, now abandoned.

(30) Foreign Application Priority Data

Nov. 28, 2006    (KR) .......................... 10-2006-118378

(51) Int. Cl.
*H01J 1/62*    (2006.01)
*H01J 63/04*    (2006.01)

(52) U.S. Cl. ........... 313/504; 257/98; 313/501; 313/503

(58) Field of Classification Search .................. 313/504, 313/502, 503; 257/98
See application file for complete search history.

(56) References Cited

U.S. PATENT DOCUMENTS

| 6,656,611 | B2 | 12/2003 | Tai et al. |
| 6,872,472 | B2 | 3/2005 | Liao et al. |
| 7,267,891 | B2 | 9/2007 | Saito |
| 2005/0162075 | A1 | 7/2005 | Madathil et al. |
| 2005/0208330 | A1* | 9/2005 | Raychaudhuri et al. ...... 428/690 |
| 2006/0022590 | A1 | 2/2006 | Aziz et al. |
| 2006/0113529 | A1 | 6/2006 | Lee et al. |
| 2006/0158098 | A1 | 7/2006 | Raychaudhuri et al. |
| 2007/0222371 | A1 | 9/2007 | Raychaudhuri et al. |
| 2008/0129191 | A1* | 6/2008 | Lee et al. ...................... 313/504 |
| 2008/0241561 | A1 | 10/2008 | Jeong et al. |
| 2009/0267503 | A1 | 10/2009 | Kobayashi |

FOREIGN PATENT DOCUMENTS

| KR | 10-2006-0059721 | 6/2006 |
| KR | 10-2006-0060171 | 6/2006 |
| KR | 10-2006-0102446 | 9/2006 |
| WO | WO 03/059015 | 7/2003 |
| WO | WO 2006095553 A1 * | 9/2006 |

OTHER PUBLICATIONS

Hsu et al., Highly efficient top-emitting white organic electroluminescent devices, SID 05 Digest, pp. 32-35 (2005). Notice of Allowance issued Oct. 29, 2007 in Korean Patent Application No. 10-2006-0118378.

* cited by examiner

*Primary Examiner* — Mariceli Santiago
*Assistant Examiner* — Glenn Zimmerman
(74) *Attorney, Agent, or Firm* — Knobbe Martens Olson & Bear, LLP.

(57) ABSTRACT

An organic light emitting display device (OLED) suppressing a resonance effect and having an enhanced luminance, and a method of fabricating the same, are disclosed. One embodiment of the OLED includes: a substrate; a first electrode disposed over the substrate and having a reflective layer; an organic layer disposed over the first electrode and having a white emission layer; a second electrode disposed over the organic layer; and a transmittance controlled layer (TCL) disposed over the second electrode and having an optical path length of about 260 to about 1520 Å.

22 Claims, 9 Drawing Sheets

PRIOR ART

ORGANIC LIGHT EMITTING DISPLAY DEVICE WITH TRANSMITTANCE CONTROL LAYER AND METHOD OF FABRICATING THE SAME

CROSS-REFERENCE TO RELATED APPLICATIONS

This application is a continuation of U.S. patent application Ser. No. 11/942,306 filed on Nov. 19, 2007, which claims the benefit of Korean Patent Application No. 10-2006-118378, filed on Nov. 28, 2006, the disclosures of which are hereby incorporated herein by reference in their entirety.

BACKGROUND

1. Field

The present disclosure relates to an organic light emitting display device (OLED) and a method of fabricating the same.

2. Description of the Related Technology

An OLED typically includes a substrate, an anode disposed on the substrate, an emission layer (EML) disposed on the anode, and a cathode disposed on the emission layer. In such an OLED, holes and electrons are injected into the emission layer when a voltage is applied between the anode and the cathode. The holes and electrons recombine with each other in the emission layer to generate excitons. When these excitons transition from an excited state to a ground state, light is emitted.

Full-color OLEDs may have emission layers, each emitting one of red (R), green (G) and blue (B) colors. However, the R, G and B emission layers in the OLEDs have different luminance efficiencies (Cd/A). The difference in the luminance efficiency causes the luminance of each emission layer to be different. The luminance is generally proportional to a current value. Accordingly, if the same current flows through emission layers of different colors, one color may have a lower luminance whereas another color may have a higher luminance. This makes it difficult to obtain proper color balance or white balance.

For example, since the luminance efficiency of a G emission layer is three to six times higher than those of R and B emission layers, more current needs to be applied to the R and B emission layers to achieve the white balance.

To solve this problem, a method has been proposed including forming an emission layer that emits light of a single color, i.e., a white (W) color, and then forming a color filter layer for extracting light corresponding to a predetermined color from the emission layer, or alternatively a color conversion layer for converting light from the emission layer to light of a predetermined color.

FIG. 1 is a cross-sectional view of one example of a top-emission OLED. Referring to FIG. 1, a substrate 100 is provided. A first electrode 110 including a reflective layer is formed on the substrate 100. A thin film transistor may be interposed between the first electrode 110 and the substrate 100. An organic layer 120 including an emission layer, which may have a single layer or multiple sublayers, is formed on the first electrode 110. In an arrangement in which a W emission layer and a color filter are used to realize a full-color OLED, the organic layer 120 may have a stacked structure of R, G, and B emission layers. A second electrode 130 is formed of a transflective or translucent material on the organic layer 120, thereby completing the OLED. The transflective material may have a transmittance of less than about 90%.

In the illustrated OLED, a resonance effect may occur because the second electrode is formed of a transflective material. Three peaks for R, G, and B light in the electroluminescence (EL) spectrum thereof may not be uniform because of the resonance effect, and thus the white light cannot be maintained. Also, light of different wavelengths may be emitted depending on a viewing angle due to the resonance effect. The resonance effect is significantly affected by the thickness of the organic layer. Thus, a wavelength band of light to be filtered varies depending on the thickness distribution of the organic layer, causing color and luminance to be adversely affected.

SUMMARY

One embodiment provides an organic light emitting display device (OLED), comprising: a substrate; a first electrode formed over the substrate, the first electrode comprising a reflective layer, the reflective layer being substantially reflective to visible light; an organic layer formed over the first electrode, the organic layer comprising at least one light emission layer configured to emit white light; a second electrode formed over the organic layer; and a transmittance controlled layer (TCL) formed on the second electrode, the transmittance controlled layer having an optical path length of about 260 Å to about 1520 Å, wherein the optical path length extends in the direction of the thickness of the transmittance controlled layer.

The reflective layer may comprise at least one selected from the group consisting of aluminum, silver and an alloy thereof. The at least one light emission layer may be a single layer. The at least one light emission layer may comprise multiple layers. The multiple layers may comprise an orange-red emission layer and a blue emission layer. The multiple layers may comprise at least two of a blue emission layer, a green emission layer, and a red emission layer. The second electrode may comprise at least one of MgAg and AlAg. The transmittance controlled layer may comprise at least one selected from the group consisting of $SiN_x$, $SiO_2$, SiON, $MgF_2$, ZnS, ZnSe, $TeO_2$, $ZrO_2$, an arylenediamine derivative, a triamine derivative, 4,4'-N,N'-dicarbazol-biphenyl (CBP), and an aluminum quinoline (Alq3) complex.

Another embodiment provides a method of fabricating an organic light emitting display device (OLED), comprising: providing a substrate; forming a first electrode including a reflective layer over the substrate; forming an organic layer including a light emission layer over the first electrode, the light emission layer being configured to emit white light; forming a second electrode over the organic layer; and forming a transmittance controlled layer (TCL) having an optical path length of about 260 Å to about 1520 Å on the second electrode.

The organic layer may be formed by one of a vacuum deposition method, an inkjet printing method, and a laser induced thermal imaging method. The transmittance controlled layer may be formed by a vacuum deposition method or a lithography method.

Yet another embodiment provides an organic light emitting display device (OLED), comprising: an anode electrode comprising a reflective layer configured to be at least partially reflective to visible light; a cathode electrode opposing the anode electrode and being partially reflective to visible light; an organic light emitting layer interposed between the anode and cathode electrodes, the organic light emitting layer being configured to emit white light; and an optical layer contacting the cathode electrode interposed between the optical layer and the organic light emitting layer, wherein the optical layer is at least partially transparent to visible light and is configured to reduce optical resonance caused by multiple reflections of visible light between the anode and cathode electrodes, wherein the device is configured to emit the white light through the cathode electrode and the optical layer.

The optical layer may have an optical path length (OPL) represented by Formula 1:

$$OPL = t \times n \qquad \text{Formula 1}$$

wherein t is the thickness of the optical layer, and n is the refractive index of the optical layer, and wherein the OPL of the optical layer is from about 260 Å to about 1520 Å.

The cathode electrode may have a transmittance of less than about 90% to visible light. The cathode electrode may comprise at least one selected from the group consisting of MgAg and AlAg. The optical layer may comprise at least one selected from the group consisting of $SiN_x$, $SiO_2$, SiON, $MgF_2$, ZnS, ZnSe, $TeO_2$, $ZrO_2$, an arylenediamine derivative, a triamine derivative, 4,4'-N,N'-dicarbazol-biphenyl (CBP), and an aluminum quinoline (Alq3) complex. The OLED may further comprise a color filter layer configured to filter the white light emitting from the organic light emitting layer.

The white light may have at least two emission peaks in the electroluminescence spectrum thereof, and the emission peaks may have substantially more uniform peak heights than those of white light emitting from the organic light emitting layer in the absence of the optical layer. The organic light emitting layer may comprise at least two organic light emitting materials configured to emit lights of different colors. The organic light emitting layer may comprise at least two sublayers stacked over each other, each of the sublayers being configured to emit light of a different color.

BRIEF DESCRIPTION OF THE DRAWINGS

The above and other features of the instant disclosure will be described in respect to certain exemplary embodiments thereof with reference to the attached drawings in which.

DETAILED DESCRIPTION

The instant disclosure will now be described below with reference to the accompanying drawings, in which exemplary embodiments are shown.

Figure 1:
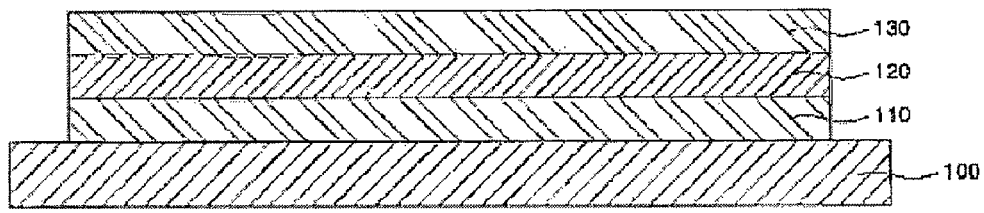
FIG. 1 is a cross-sectional view of an example of a top-emission OLED.
Figure 2:
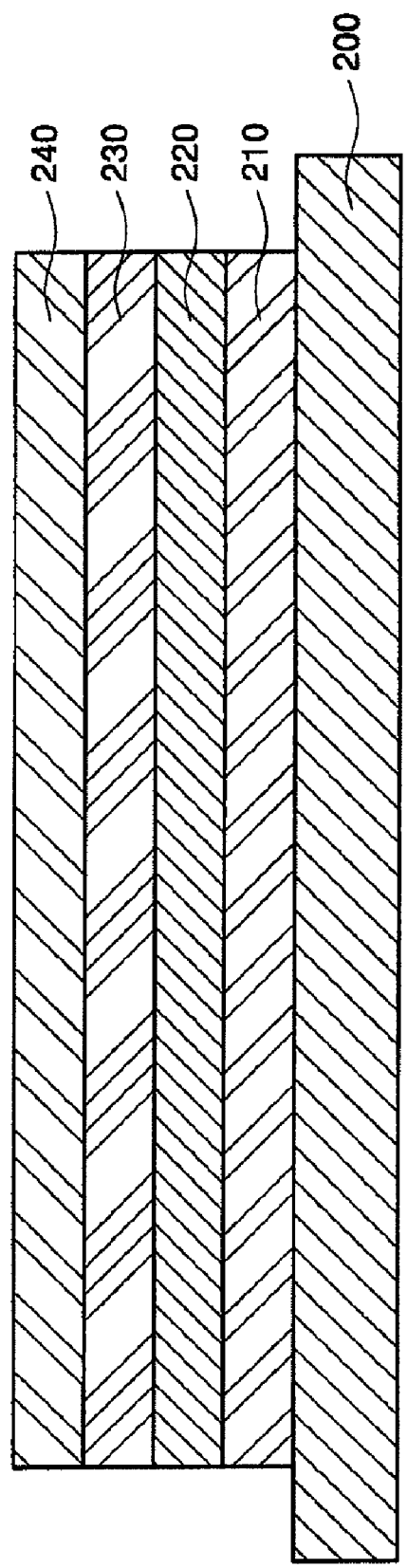
FIG. 2 is a cross-sectional view of an OLED according to one embodiment.

FIG. 2 is a cross-sectional view of an OLED according to an exemplary embodiment. Referring to FIG. 2, a substrate 200 is provided. A first electrode 210 may be formed on the substrate 200. The first electrode 210 may have a double-layered structure or a triple-layered structure, including a reflective layer. When the first electrode 210 has a double-layered structure, it may have a stacked structure of a reflective layer formed of aluminum, silver or an alloy thereof, and a transparent conductivity layer formed of one of indium tin oxide (ITO), indium zinc oxide (IZO) and an indium tin zinc oxide (ITZO). When the first electrode 210 has a triple-layered structure, it may have a stacked structure of a first metal layer formed of one of titanium, molybdenum, ITO or an alloy thereof, a second metal layer formed of aluminum, silver, or an alloy thereof, and a third metal layer formed of one of ITO, IZO, and ITZO. In addition, a thin film transistor, a capacitor or the like may be interposed between the substrate 200 and the first electrode 210.

An organic layer 220 including a white (W) emission layer is formed on the first electrode 210. In one embodiment, the white emission layer may be a single layer. The white emission layer may include emissive materials emitting different colors and dopants. In some embodiments, the white emission layer may include a carbazole polymer (e.g., polyvinylcarbazole (PVK)) and polybutadiene (PBD), tetraphenyl butadiene (TPB), Coumarin6, DCM1, Nile red at a suitable ratio. Emissive materials of two different colors may be mixed together and another emissive material of a different color may be added to obtain a W color emissive material. For example, an R color emissive material and a G color emissive material may be mixed together, and a B color emissive material may be added to obtain the W color emissive material. The R color emissive material may be polythiophene (PT) or its derivative which is a polymeric material. The G color emissive material may be one of aluminum quinoline complex (Alq3), 10-benzo[h]quinolinol-beryllium complex (BeBq2) and tris(4-methyl-8-quinolinolato) aluminum (III) (Almq) (low molecular materials), and poly(p-phenylenevinylene) (PPV) and its derivative (polymeric materials). The B color emissive material may be one of ZnPBO, Balq, 4,4-bis(2,2-diphenylvinyl)1,1-biphenyl(DPVBi), and OXA-D (low molecular materials), and polyphenylene (PPP) and its derivative (polymeric materials).

The white emission layer may include multiple layers. In one embodiment, the white emission layer may include two layers, each emitting light of different wavelengths. One of the layers may be an emission layer emitting light of an orange-red (OR) region while the other layer may be an emission layer emitting light of a B region. The emission layer emitting light of the OR region may be a phosphorescent emission layer, while the emission layer emitting light of the B region may be a fluorescent emission layer. The phosphorescent emission layer has a good emissive characteristic compared to the fluorescent emission layer emitting light of the same wavelength range. The fluorescent emission layer has a good lifetime characteristic compared to the phosphorescent emission layer. Therefore, the W emission layer, which has the phosphorescent emission layer emitting light of OR region and the fluorescent emission layer emitting light of B region, can have good luminous efficiency and good lifetime characteristics. Also, the double-layered W emission layer may include a polymeric material and/or a low molecular material.

In yet another embodiment, the W emission layer may include three layers, e.g., R, G and B emission layers stacked over one another. The layers may be stacked in any order. The R emission layer may include low molecular materials such as Alq3 (host)/DCJTB(4-(Dicyanomethylene)-2-t-butyl-6-(1,1,7,7-tetramethyljulolidyl-9-enyl)-4H-pyran; fluorescent dopant), Alq3(host)/DCM(4-(dicyanomethylene)-2-methyl- 6-[p-(dimethylamino)styryl]-4H-pyran; fluorescent dopant), 4,4'-N,N'-dicarbazol-biphenyl (CBP) (host)/PtOEP (phosphorescent organic metal complex), and polymeric materials such as a PFO-based polymer and a PPV-based polymer. The G emission layer may include low molecular materials such as Alq3, Alq3(host)/C545t(dopant), CBP(host)/IrPPY(phosphorescent organic complex), and polymeric materials such as a PFO-based polymer and a PPV-based polymer. The G emission layer may also include low molecular materials such as DPVBi, spiro-DPVBi, spiro-6P, distylbenzene (DSB), distrylarylene (DSA), and polymeric materials such as a PFO-based polymer and a PPV-based polymer.

The organic layer 220 may further include at least one of a hole injection layer, a hole transport layer, an electron injection layer, an electron transport layer, and a hole blocking layer.

The hole injection layer serves to facilitate injection of holes into the organic emission layer of the OLED to increase the lifetime of the OLED. The hole injection layer may be formed of an arylamine compound, starburst type amine, and the like. In one embodiment, it may be formed of 4,4,4-tris(3-methylphenylamino)triphenylamino(m-MTDATA), 1,3,5-tris[4-(3-methylphenylamino)phenyl]benzene (m-MTDATB), or phthalocyanine copper (CuPc).

The hole transport layer may be formed of an arylene diamine derivative, a starburst type compound, a biphenyl-diamine derivative having a spiro radical, a ladder type compound, and the like. In one embodiment, it may be formed of N,N-diphenyl-N,N-bis)4-methylphenyl)-1,1-biphenyl-4,4-diamine (TPD) or a 4,4-bis[N-(1-napril)-N-phenylamino]biphenyl (NPB).

The hole blocking layer serves to prevent holes from moving into the electron injection layer when the electron mobility is higher than the hole mobility in the organic emission layer. The hole blocking layer may be formed of 2-biphenyl-4-il-5-(4-t-butylphenyl)-1,3,4-oxydiazole (PBD), spiro-PBD, or 3-(4-t-butylphenyl)-4-phenyl-5-(4-biphenyl)-1,2,4-triazole (TAZ).

The electron transport layer may be formed of a metallic compound which has good electric conductivity. The electron transfer layer may be formed of 8-hydroquinoline aluminum salt (Alq3). The electron transfer layer facilitates transporting electrons supplied from the cathode electrode. The electron injection layer may include at least one material selected from the group consisting of a 1,3,4-oxydiazole derivative, 1,2,4-trizole derivative, and LiF. The organic layer 220 may be formed by one of a vacuum deposition method, an inkjet printing method, and a laser induced thermal imaging method.

A second electrode 230 is formed on the organic layer 220. The second electrode 230 may be formed of a transflective or translucent material. The transflective material may have a transmittance of less than about 90%. Examples of the transflective material include, but are not limited to, MgAg and AlAg. A MgAg layer may be formed by depositing Mg and Ag simultaneously. AlAg may be formed by sequentially depositing Al and Ag to have a stacked structure. Also, a transparent conductivity layer such as ITO or IZO may be further formed on the second electrode 230.

A transmittance controlled layer 240 (TCL) is formed on the second electrode 230. The TCL 240 is configured to control the transmittance and reflectance of the second electrode 230 using interference effect.

The TCL 240 serves to adjust the intensity of transmissive spectrum per wavelength band. An OLED emitting W color needs to have a characteristic that the transmittance in a visible wavelength band (particularly, about 450 to about 650 nm) is almost uniform throughout the display array thereof. However, a possibility of having different R, G and B color intensities in the light source spectrum thereof is high, and the TCL 240 functions to adjust the intensities.

Here, the transmissive spectrum refers to an emission rate depending on the wavelength when light emits from the organic layer 220 to the outside of the OLED. Further, the interference effect in the context of this document refers to an effect that light reflected at an interface between the TCL 240 and the outer air is reflected again at a surface of the second electrode 230 before emitting outside. The refractive index of the TLC 240 is a controlling factor affecting the interference effect. The refractive index, however, may vary depending on the thickness of the TCL 240 and the wavelength of light.

Furthermore, the TCL 240 may have an Optical Path Length (OPL) of about 260 to about 1520 Å. When the TCL 240 has such an OPL, an optimal emission can be obtained such that the transmissive spectrum of the OLED emitting W color light becomes substantially uniform over a wavelength band of about 450 nm to about 650 nm.

In addition, when the transmittance for the optimal design is set as reference transmittance and the transmittance is at least a half of the reference transmittance in a visible wavelength band of about 450 to about 650 nm, the optical path length of 260 to 1520 Å of the TCL 240 is met. Here, the optical path length refers to a value resulting from the thickness multiplied by the refractive index of the TCL 240. The optical path length (OPL) may be represented by Formula 1:

$$OPL = t \times n \quad \text{Formula 1}$$

In Formula 1, t is the thickness of the TCL 240, and n is the refractive index of the TCL 240. The OPL is generally proportional to the wavelength corresponding to the transmissive spectrum. As described above, the refractive index of the TCL 240 may vary depending on the wavelength. The thickness of the TCL 240 may also vary depending on the refractive index of the material for the TCL 240. Thus, the refractive index and the thickness are not specifically limited as long as a product of the refractive index and the thickness falls within the optical path length range of the TCL 240 described above.

The TCL 240 may be formed of an at least partially transparent material. The material may not have too high absorption and reflectance properties or too low transmittance. In one embodiment, the TCL 240 may include at least one of $SiN_x$, $SiO_2$, $SiON$, $MgF_2$, $ZnS$, $ZnSe$, $TeO_2$, $ZrO_2$, an arylenediamine derivative, a triamine derivative, 4,4'-N,N'-dicarbazol-biphenyl (CBP), and an Alq3 complex. The TCL 240 may be formed by a vacuum deposition method or a lithography method.

Hereinafter, the instant disclosure will be described in detail with reference to exemplary embodiments, but it is not limited to the exemplary embodiments.

Exemplary Embodiment 1

Silver having a thickness of 1000 Å was formed on a substrate, and ITO having a thickness of 70 Å was formed on the silver. IDE406 (available from IDEMITSU Kosan Co., Ltd., Tokyo, Japan) having a thickness of 250 Å was formed on the ITO as a hole injection layer. IDE320 (available from IDEMITSU Co., Ltd.) having a thickness of 150 Å was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer.

A G emission layer containing CBP available from Universal Display Corporation (UDC; Ewing, N.J.), as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co., Frankfurt, Germany, as a dopant material in the amount of 12 wt % was formed to a thickness of 100 Å on the G emission layer. Balq having a thickness of 50 Å and available from UDC Co. was formed on the R emission layer as a hole blocking layer, and Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and IDE320 available from IDEMITSU Co. was formed to a thickness of 400 Å on the Ag as a TCL.

Exemplary Embodiment 2

Silver having a thickness of 1000 Å was formed on a substrate, and ITO having a thickness of 70 Å was formed on the silver. IDE406 (available from IDEMITSU Co.) having a thickness of 250 Å was formed on the ITO as a hole injection layer. IDE320 (available from IDEMITSU Co.) having a thickness of 150 Å was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer, and Alq3 having a thickness of 200 Å was formed on the hole blocking layer as an electron transport layer. LiF having a thickness of 5 Å was formed on the electron transport layer as an electron injection layer. Al having a thickness of 20 Å and Ag having a thickness of 70 Å were sequentially formed on the electron injection layer as a second electrode, and IDE320 having a thickness of 300 Å and available from IDEMITSU Co. was formed on the Ag as a TCL.

Exemplary Embodiment 3

Silver having a thickness of 1000 Å was formed on a substrate, and ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. Also, a B emission layer containing BH215 available from IDEMITSU Co. as a host material and BD052 available from IDEMITSU Co. as a dopant material in the amount of 1 wt % was formed to a thickness of 80 Å on the hole transport layer, and a G emission layer containing CBP available from UDC Co. as a host material and GD33 available from UDC Co. as a dopant material in the amount of 7 wt % was formed to a thickness of 120 Å on the blue emission layer. Further, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer, and Alq3 having a thickness of 200 Å was formed on the hole blocking layer as an electron transport layer. LiF having a thickness of 5 Å was formed on the electron transport layer as an electron injection layer, and Al having a thickness of 20 Å and Ag having a thickness of 70 Å were sequentially formed on the electron injection layer as a second electrode. IDE320 having a thickness of 500 Å and available from IDEMITSU Co. was formed on the Ag as a TCL.

Exemplary Embodiment 4

Silver having a thickness of 1000 Å was formed on a substrate. ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. Also, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer. Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and MgF2 having a thickness of 550 Å was formed on the Ag as a TCL.

Exemplary Embodiment 5

Silver having a thickness of 1000 Å was formed on a substrate. ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer.

Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and MgF2 having a thickness of 703 Å was formed on the Ag as a TCL.

Exemplary Embodiment 6

Silver having a thickness of 1000 Å was formed on a substrate. ITO having a thickness of 70 Å was formed on the silver. IDE406 having a thickness of 250 Å and available from IDEMITSU. Co. was formed on the ITO as a hole injection layer. IDE320 having a thickness of 150 Å and available from IDEMITSU Co. was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer. Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and MgF2 having a thickness of 1101 Å was formed on the Ag as a TCL.

Exemplary Embodiment 7

Silver having a thickness of 1000 Å was formed on a substrate. ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer. Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and ZnSe having a thickness of 250 Å was formed on the Ag as a TCL.

Exemplary Embodiment 8

Silver having a thickness of 1000 Å was formed on a substrate. ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer. Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and ZnSe having a thickness of 250 Å was formed on the Ag as a TCL.

Exemplary Embodiment 9

Silver having a thickness of 1000 Å was formed on a substrate. ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. Further, a B emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer. Alq3 having a thickness of 100 Å was formed on the hole blocking layer as an electron transport layer. LiF having a thickness of 5 Å was formed on the electron transport layer as an electron injection layer. Al having a thickness of 20 Å and Ag having a thickness of 70 Å were formed on the electron injection layer as a second electrode, and ZnSe having a thickness of 400 Å was formed on the Ag as a TCL.

Comparative Example 1

Silver having a thickness of 1000 Å was formed on a substrate. ITO having a thickness of 70 Å was formed on the silver. IDE406 having a thickness of 250 Å and available from IDEMITSU Co. was formed on the ITO as a hole injection layer. IDE320 having a thickness of 150 Å and available from IDEMITSU Co. was formed on the hole injection layer as a hole transport layer. A blue emission layer containing BH215 available from IDEMITSU Co. as a host material and BD052 available from IDEMITSU Co. as a dopant material in the amount of 1 wt % was formed to a thickness of 80 Å on the hole transport layer. A G emission layer containing CBP available from UDC Co. as a host material and GD33 available from UDC Co. as a dopant material in the amount of 7 wt % was formed to a thickness of 120 Å on the B emission layer. Also, an R emission layer containing CBP available from UDC Co. as a host material and TER004 available from COVION Co. as a dopant material in the amount of 12 wt % was formed to a thickness of 100 Å on the G emission layer. Balq having a thickness of 50 Å and available from UDC Co. was formed on the R emission layer as a hole blocking layer. Alq3 having a thickness of 200 Å was formed on the hole blocking layer as an electron transport layer. LiF having a thickness of 5 Å was formed on the electron transport layer as an electron injection layer. Al having a thickness of 20 Å and Ag having a thickness of 70 Å were sequentially formed on the electron injection layer as a second electrode.

Figure 3:
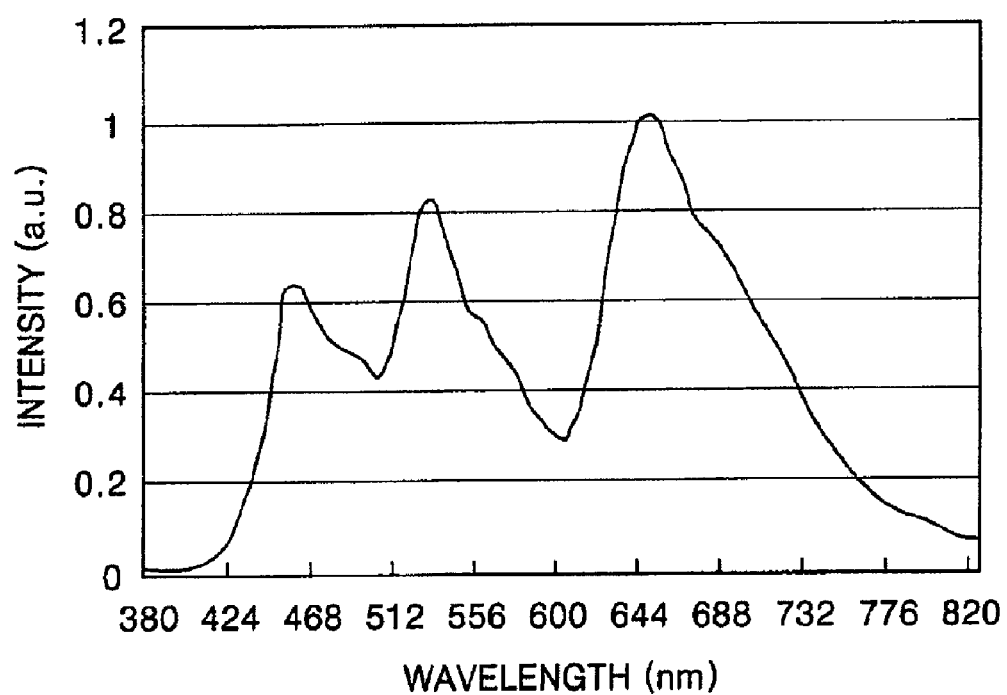
FIG. 3 is a graph showing an EL spectrum of Exemplary Embodiment 1.
Figure 4:
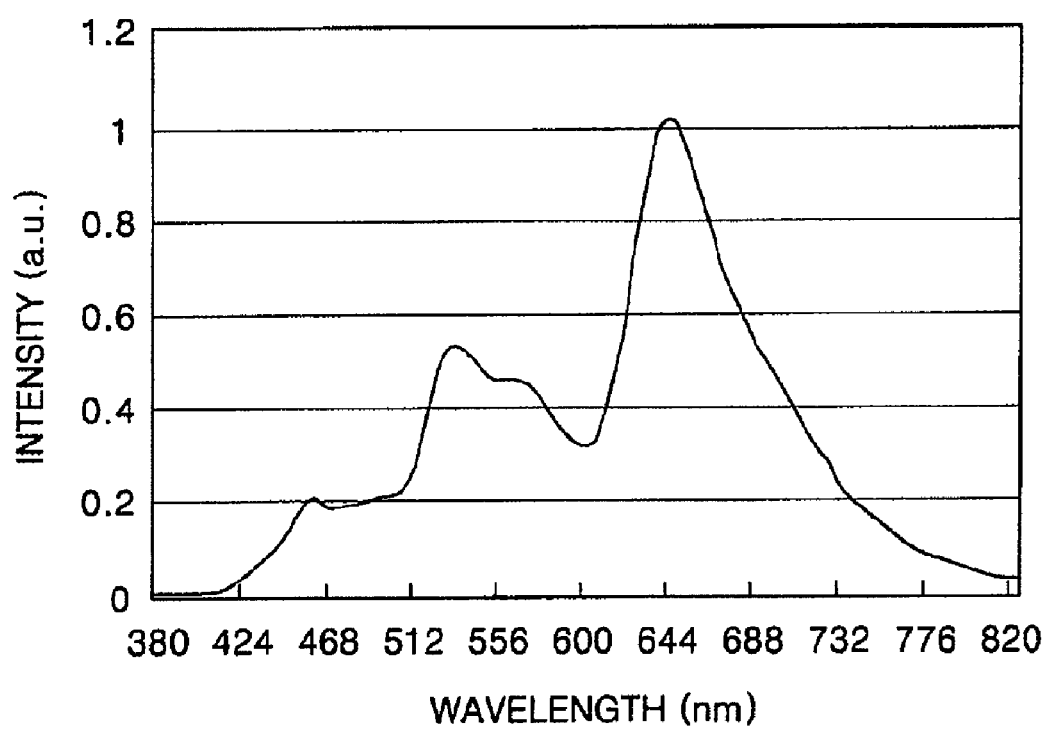
FIG. 4 is a graph showing an EL spectrum of Comparative example 1.

FIG. 3 is a graph showing an electroluminescence (EL) spectrum of Exemplary Embodiment 1, and FIG. 4 is a graph showing an EL spectrum of Comparative example 1. The x axis of each of the graphs denotes a wavelength (unit: nm) while the y axis of each of the graphs denotes an intensity (a.u.: arbitrary unit).

Referring to FIG. 3, the B peak has a maximum peak in a wavelength region of 424 to 468 nm and its intensity is approximately 4.5. The G peak has a maximum peak in a wavelength region of 512 to 556 nm and its intensity is approximately 0.8. The R peak has a maximum peak in a wavelength region of 644 nm and its intensity is approximately 1. Here, the refractive index of the TCL of Exemplary Embodiment 1 is 1.8 in the visible light wavelength band, and the optical path length of the TCL of Exemplary Embodiment 1 is 780 Å.

Referring to FIG. 4, the B peak has a maximum peak in a wavelength region of 468 nm and its intensity is approximately 0.2. The G peak has a maximum peak in a wavelength region of 512 to 556 nm and its intensity is approximately 0.5. The R peak has a maximum peak in a wavelength region of 644 nm and its intensity is approximately 1. It can be seen that the B, G, and R peaks of Exemplary Embodiment 1 having the TCL are more uniform than those of Comparative example 1 having no TCL.

Figure 5:
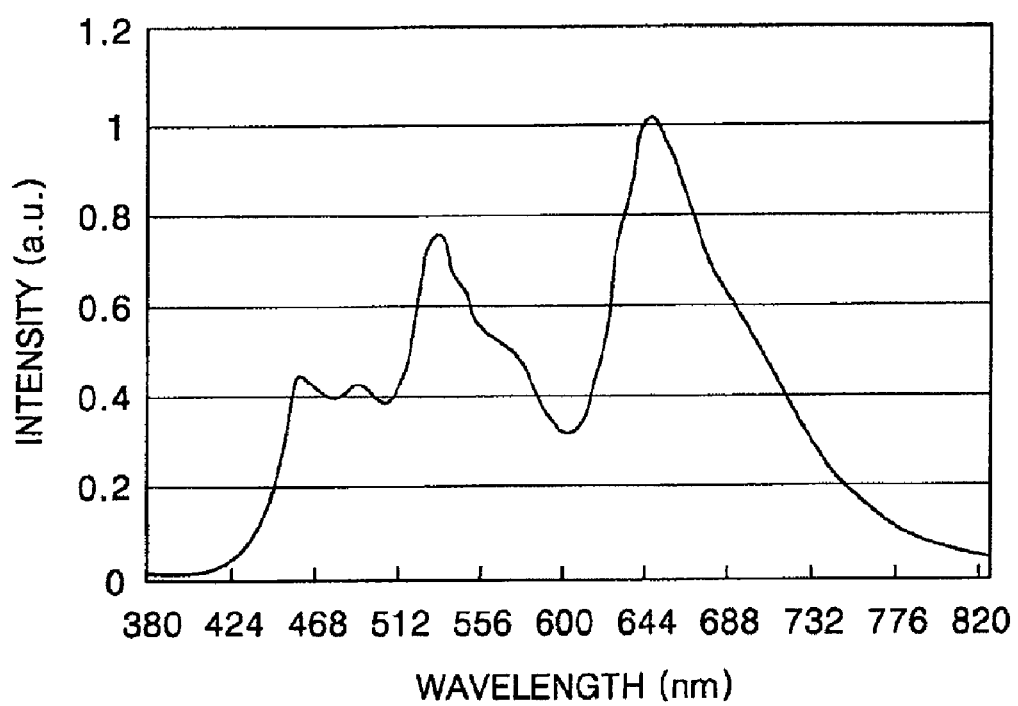
FIG. 5 is a graph showing an EL spectrum of Exemplary Embodiment 2.

FIG. 5 is a graph showing an EL spectrum of Exemplary Embodiment 2. The x axis of the graph denotes a wavelength (unit: nm), and the y axis of the graph denotes an intensity (a.u.: arbitrary unit).

Referring to FIG. 5, the B peak has a maximum peak near a wavelength region of 468 nm and its intensity is approximately 0.4. The G peak has a maximum peak in a wavelength region of 512 to 556 nm and its intensity is approximately 0.7. The R peak has a maximum peak in a wavelength region of 644 to 688 nm and its intensity is approximately 1. Also, the refractive index of the TCL of Exemplary Embodiment 2 is 1.8 in the visible light wavelength band, and the optical path length of the TCL of Exemplary Embodiment 2 is 540 Å.

Figure 6:
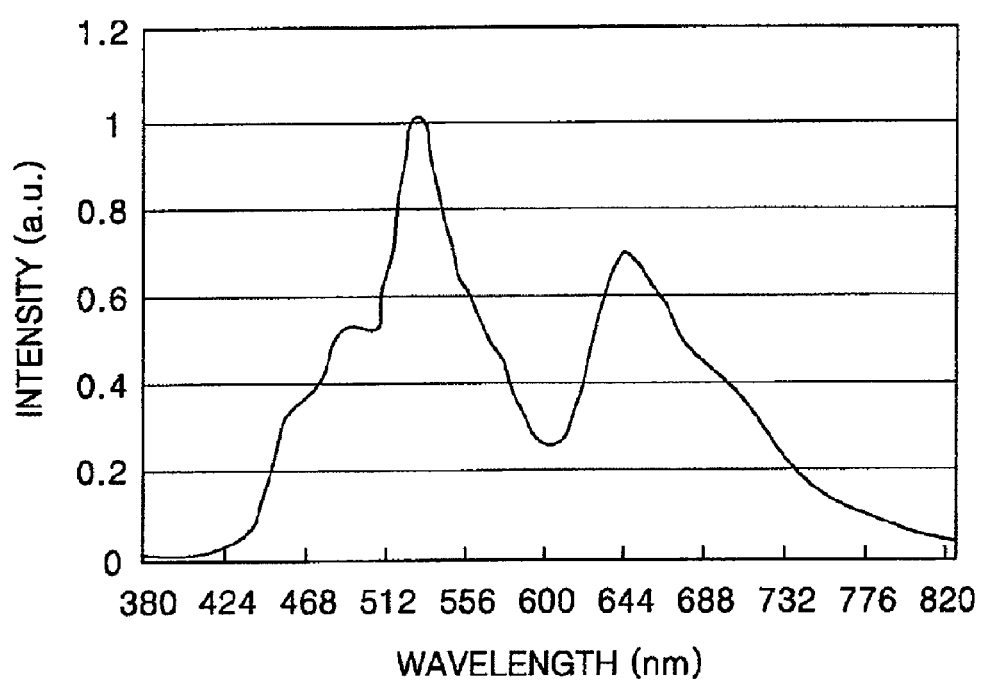
FIG. 6 is a graph showing an EL spectrum of Exemplary Embodiment 3.

FIG. 6 is a graph showing an EL spectrum of Exemplary Embodiment 3. The x axis of the graph denotes a wavelength (unit: nm), and the y axis of the graph denotes an intensity (a.u.: arbitrary unit). Referring to FIG. 6, the B peak has a little shoulder peak in a wavelength region of 424 to 468 nm and its intensity is approximately 0.3. The G peak has a maximum peak in a wavelength region of 512 to 556 nm and its intensity is approximately 1. The R peak has a maximum peak in a wavelength region of 644 to 688 nm and its intensity is approximately 0.7. Here, the refractive index of the TCL of Exemplary Embodiment 3 is 1.8 in the visible light wavelength band, and the optical path length of the TCL of Exemplary Embodiment 3 is 900 Å.

As such, referring to FIGS. 3 to 5, it can be seen that the intensity of the B peak decreases and the intensity of the G peak increases as the thickness of the TCL increases. Also, it can be seen that the R peak decreases when the thickness of the TCL is not greater than a predetermined level.

Figure 7:
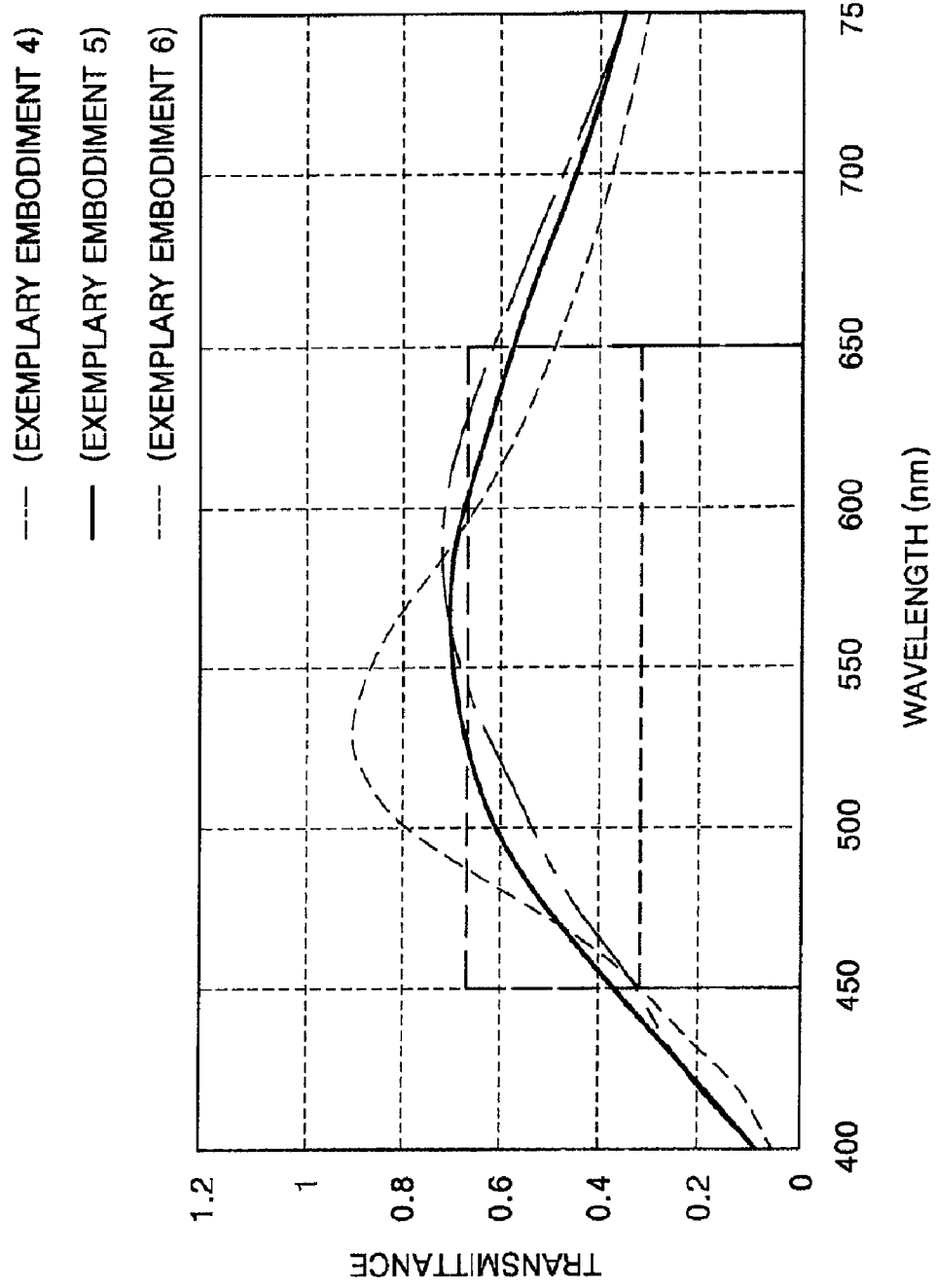
FIG. 7 is a graph showing transmissive spectrums of Exemplary Embodiment 4, Exemplary Embodiment 5, and Exemplary Embodiment 6.

FIG. 7 is a graph showing transmissive spectrums of Exemplary Embodiment 4, Exemplary Embodiment 5, and Exemplary Embodiment 6. The x axis of the graph denotes a wavelength (unit: nm), and the y axis of the graph denotes a transmittance.

Referring to FIG. 7, the transmittance in a wavelength region of 450 to 650 nm has a smooth curve between 0.35 and 0.70 in Exemplary Embodiment 4. The transmittance in a wavelength region of 450 to 650 nm has a smooth curve between 0.35 and 0.70 in Exemplary Embodiment 5. Also, the transmittance of Exemplary Embodiment 6 is approximately 0.9 in a wavelength region of 500 to 550 nm and is 0.35 to 0.9 in a wavelength region of 450 to 650 nm.

$MgF_2$ used for the TCL has a refractive index of 1.38 in Exemplary Embodiment 4, Exemplary Embodiment 5, and Exemplary Embodiment 6. The optical path length of the TCL of the instant disclosure is 260 to 1520 Å. The optical path lengths of the TCL of Exemplary Embodiment 4, Exemplary Embodiment 5, Exemplary Embodiment 6 are 760 Å, 970 Å, and 1520 Å, respectively. Accordingly, it can be seen that the optical path length of the embodiments is in a range of the optical path length of the TCL described above.

Also, it can be seen that transmissive spectrums become substantially flat near approximately 0.6 of the transmittances of Exemplary Embodiment 4 and Exemplary Embodiment 5. This transmittance is referred to as a reference transmittance. It can be seen that transmissive spectrums of Exemplary Embodiment 4, Exemplary Embodiment 5, and Exemplary Embodiment 6 are positioned at a transmittance not less than 0.3 which is half the reference transmittance.

Figure 8:
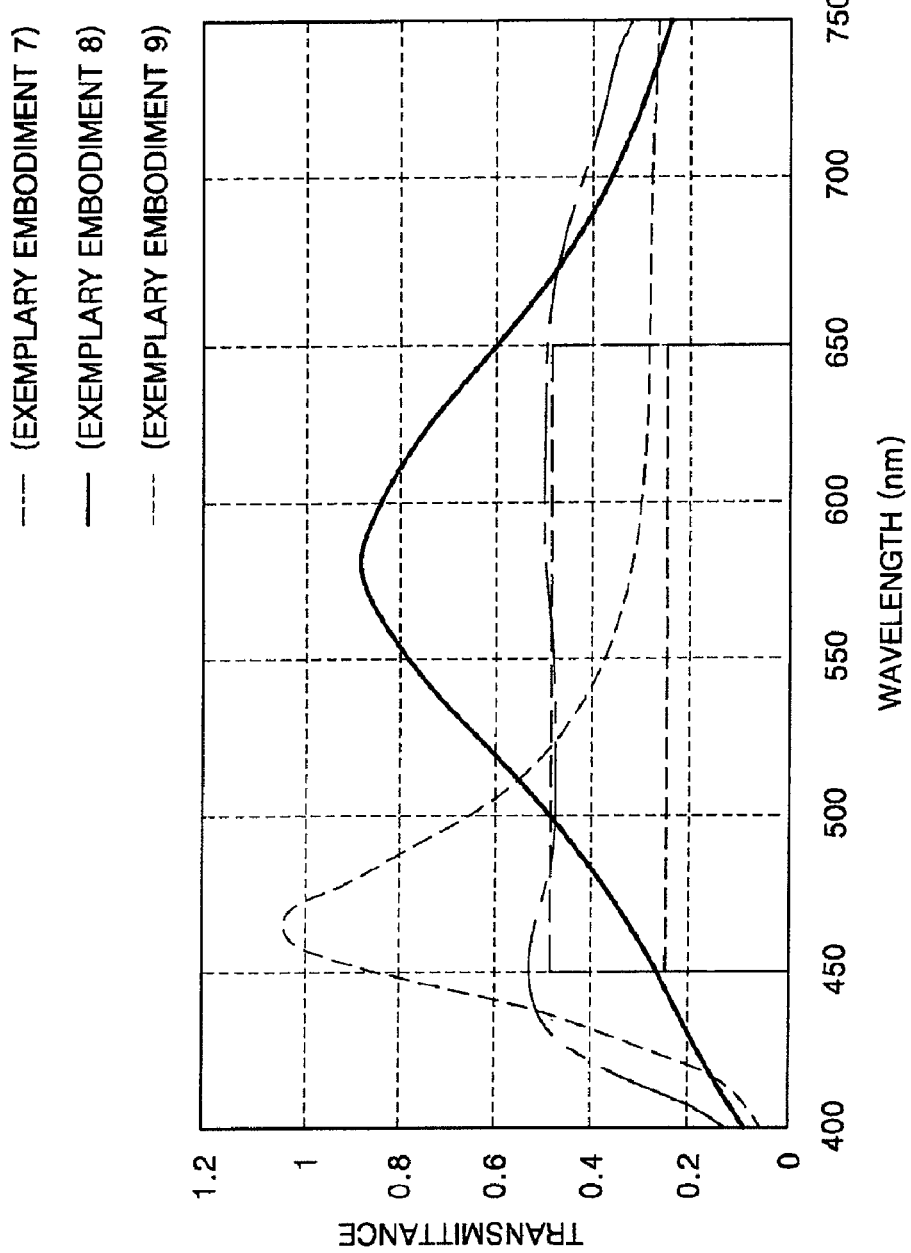
FIG. 8 is a graph showing transmissive spectrums of Exemplary Embodiment 7, Exemplary Embodiment 8, and Exemplary Embodiment 9.
Figure 9:
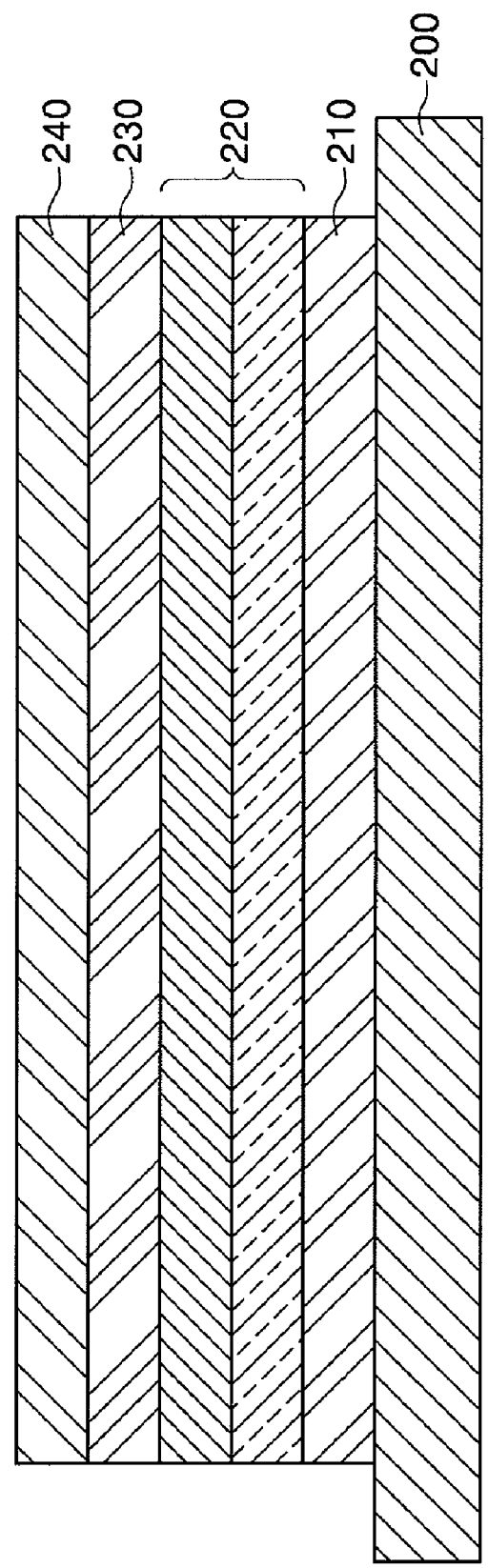
FIG. 9 is a cross-sectional view of an OLED according to another embodiment.

FIG. 8 is a graph showing transmissive spectrums of Exemplary Embodiment 7, Exemplary Embodiment 8, and Exemplary Embodiment 9. The x axis of the graph denotes a wavelength (unit: nm), and the y axis of the graph denotes a transmittance.

Referring to FIG. 8, the transmittance in a wavelength region of 450 to 650 nm has a constant value of 0.4 to 0.6 in Exemplary Embodiment 7. The transmittance in a wavelength region of 550 to 600 nm has a maximum peak in Exemplary Embodiment 8, and its transmittance is approximately 0.9. Also, the transmittance of Exemplary Embodiment 8 is approximately 0.27 to 0.9 in a wavelength region of 450 to 650 nm.

ZnSe used for the TCL of Exemplary Embodiment 7, Exemplary Embodiment 8, and Exemplary Embodiment 9 has a refractive index of 2.6, so that the optical path lengths of Exemplary Embodiment 7, Exemplary Embodiment 8, and Exemplary Embodiment 9 are 260 Å, 650 Å, and 1040 Å, respectively.

Also, the transmissive spectrum of Exemplary Embodiment 7 becomes substantially flat when the transmittance is approximately 0.5, which is referred to as a reference transmittance. The transmissive spectrums of Exemplary Embodiment 8 and Exemplary Embodiment 9 are positioned at a transmittance not less than 0.25 which is half the reference transmittance, which is suitable for the reference of the TCL of the present invention.

Table 1 shows color coordinates of Exemplary Embodiment 1, Exemplary Embodiment 2, Exemplary Embodiment 3, and Comparative example 1.

TABLE 1

|  | X color coordinate | Y color coordinate |
| --- | --- | --- |
| Exemplary Embodiment 1 | 0.364 | 0.339 |
| Exemplary Embodiment 2 | 0.382 | 0.376 |
| Exemplary Embodiment 3 | 0.333 | 0.412 |
| Comparative example 1 | 0.443 | 0.400 |

Referring to Table 1, the color coordinates of Exemplary Embodiment 1 is the best, and the color coordinates are better in the order of Exemplary Embodiment 2, Exemplary Embodiment 3, and Comparative example 1. Here, the color coordinates of the OLED including the W emission layer are better when it is closer to (0.31, 0.31). The TCL disposed on the second electrode can minimize the resonance effect while enhancing luminance of the OLED.

Although the instant disclosure has been described with reference to certain exemplary embodiments thereof, it will be understood by those skilled in the art that a variety of modifications and variations may be made to the embodiments without departing from the spirit or scope of the instant disclosure defined in the appended claims, and their equivalents.

What is claimed is:

1. An organic light emitting display device (OLED), comprising:
   a substrate;
   a first electrode formed over the substrate, the first electrode comprising a reflective layer, the reflective layer being substantially reflective to visible light;
   an organic layer formed over the first electrode, the organic layer comprising at least one light emission layer configured to emit white light;
   a semi-transmissive second electrode formed over the organic layer and configured to transmit therethrough white light from the organic layer; and
   a transmittance controlled layer (TCL) formed on the second electrode and configured to regulate intensity of various frequency components of the white light from the semi-transmissive second electrode, the transmittance controlled layer having an optical path length of about 260 Å to about 1520 Å, wherein the optical path length extends in the direction of the thickness of the transmittance controlled layer,
   wherein but for the TCL, white light passing through the semi-transmissive second electrode would have an original intensity spectrum, in which a blue light peak is lower than a green light peak, which is lower than a red light peak,
   wherein by contrast, after passing through the semi-transmissive second electrode and the TCL, the white light has a regulated intensity spectrum, in which a difference between normalized values of a blue light peak and a red light peak is substantially smaller than a difference between normalized values of the blue light peak and the red light peak of the original spectrum.

2. The OLED of claim 1, wherein the reflective layer comprises at least one selected from the group consisting of aluminum, silver and an alloy thereof.

3. The OLED of claim 1, wherein the at least one light emission layer is a single layer.

4. The OLED of claim 1, wherein the at least one light emission layer comprises multiple layers.

5. The OLED of claim 4, wherein the multiple layers comprise an orange-red emission layer and a blue emission layer.

6. The OLED of claim 4, wherein the multiple layers comprise at least two of a blue emission layer, a green emission layer, and a red emission layer.

7. The OLED of claim 1, wherein the second electrode comprises at least one of MgAg and AlAg.

8. The OLED of claim 1, wherein the transmittance controlled layer comprises at least one selected from the group consisting of SiNx, $SiO_2$, SiON, $MgF_2$, ZnS, ZnSe, $TeO_2$, $ZrO_2$, an arylenediamine derivative, a triamine derivative, 4,4'-N,N'-dicarbazol-biphenyl (CBP), and an aluminum quinoline (Alq3) complex.

9. A method of fabricating an organic light emitting display device (OLED), comprising:
   providing a substrate;
   forming a first electrode including a reflective layer over the substrate;
   forming an organic layer including a light emission layer over the first electrode, the light emission layer being configured to emit white light;
   forming a second electrode over the organic layer; and
   forming a transmittance controlled layer (TCL) having an optical path length of about 260 Å to about 1520 Å on the second electrode, thereby providing the OLED of claim 1.

10. The method of claim 9, wherein the organic layer is formed by one of a vacuum deposition method, an inkjet printing method, and a laser induced thermal imaging method.

11. The method of claim 9, wherein the transmittance controlled layer is formed by a vacuum deposition method or a lithography method.

12. An organic light emitting display device (OLED), comprising:
   an anode electrode comprising a reflective layer configured to be at least partially reflective to visible light;
   a cathode electrode opposing the anode electrode and being partially reflective to visible light;
   an organic light emitting layer interposed between the anode and cathode electrodes, the organic light emitting layer being configured to emit white light; and
   an optical layer contacting the cathode electrode interposed between the optical layer and the organic light emitting layer, wherein the optical layer is at least partially transparent to visible light and is configured to reduce optical resonance caused by multiple reflections of visible light between the anode and cathode electrodes, wherein the device is configured to emit the white light through the cathode electrode and the optical layer,
   wherein but for the optical layer, white light passing through the cathode electrode would have an original intensity spectrum, in which a blue light peak is lower than a green light peak, which is lower than a red light peak,
   wherein by contrast, after passing through the cathode electrode and the optical layer, the white light has a regulated intensity spectrum, in which a difference between normalized values of a blue light peak and a red light peak is substantially smaller than a difference between normalized values of the blue light peak and the red light peak of the original spectrum.

13. The OLED of claim 12, wherein the optical layer has an optical path length (OPL) represented by Formula:

$$OPL = t \times n \quad \text{Formula}$$

wherein t is the thickness of the optical layer, and n is the refractive index of the optical layer, and wherein the OPL of the optical layer is from about 260 Å to about 1520 Å.

14. The OLED of claim 12, wherein the cathode electrode has a transmittance of less than about 90% to visible light.

15. The OLED of claim 12, wherein the cathode electrode comprises at least one selected from the group consisting of MgAg and AlAg.

16. The OLED of claim 12, wherein the optical layer comprises at least one selected from the group consisting of SiNx, $SiO_2$, SiON, $MgF_2$, ZnS, ZnSe, $TeO_2$, $ZrO_2$, an arylenediamine derivative, a triamine derivative, 4,4'-N,N'-dicarbazolbiphenyl (CBP), and an aluminum quinoline (Alq3) complex.

17. The OLED of claim 12, further comprising a color filter layer configured to filter the white light emitting from the organic light emitting layer.

18. The OLED of claim 17, wherein a green light peak has a normalized value in the regulated intensity spectrum higher than a normalized value of the green light peak in the original spectrum.

19. The OLED of claim 12, wherein the organic light emitting layer comprises at least two organic light emitting materials configured to emit lights of different colors.

20. The OLED of claim 12, wherein the organic light emitting layer comprises at least two sublayers stacked over each other, each of the sublayers being configured to emit light of a different color.

21. The OLED of claim 1, wherein a difference between normalized values of a green light peak and a red light peak in the regulated intensity spectrum is substantially smaller than a difference between normalized values of the green light peak and the red light peak of the original spectrum.

22. The OLED of claim 1, wherein a difference between normalized values of a blue light peak and a green light peak in the intensity regulated spectrum is substantially smaller than a difference between normalized values of the blue light peak and the green light peak of the original spectrum.

* * * * *